United States Patent [19]
Dreps et al.

[11] Patent Number: 5,949,262
[45] Date of Patent: Sep. 7, 1999

[54] METHOD AND APPARATUS FOR COUPLED PHASE LOCKED LOOPS

[75] Inventors: Daniel Mark Dreps, Georgetown; Robert Paul Masleid; John Stephen Muhich, both of Austin, all of Tex.

[73] Assignee: International Business Machines Corporation, Armonk, N.Y.

[21] Appl. No.: 09/004,136

[22] Filed: Jan. 7, 1998

[51] Int. Cl.[6] .................................................. H03L 7/06
[52] U.S. Cl. ........................................... 327/156; 326/158
[58] Field of Search ..................................... 327/147–150, 327/156–159, 243–245; 331/10–12; 375/356; 395/552, 555

[56] References Cited

U.S. PATENT DOCUMENTS

| | | | |
|---|---|---|---|
| 4,489,289 | 12/1984 | Slobodnik et al. | 331/107 A |
| 4,715,049 | 12/1987 | Andrews et al. | 375/354 |
| 4,801,818 | 1/1989 | Schroedinger | 327/165 |
| 4,893,271 | 1/1990 | Davis et al. | 395/556 |
| 4,903,228 | 2/1990 | Gregoire et al. | 395/565 |
| 5,150,068 | 9/1992 | Kawashima et al. | 327/147 |
| 5,150,078 | 9/1992 | Yang et al. | 331/2 |
| 5,166,952 | 11/1992 | Omurg et al. | 375/200 |
| 5,179,574 | 1/1993 | Watanabe et al. | 375/376 |
| 5,253,268 | 10/1993 | Omura et al. | 375/200 |
| 5,317,284 | 5/1994 | Yang | 331/2 |
| 5,349,310 | 9/1994 | Rieder et al. | 331/18 |
| 5,396,523 | 3/1995 | Hedberg | 375/373 |
| 5,526,380 | 6/1996 | Izzard | 375/375 |
| 5,544,203 | 8/1996 | Casasanta et al. | 327/150 |
| 5,631,591 | 5/1997 | Bar-Niv | 327/149 |

FOREIGN PATENT DOCUMENTS 2128824  5/1984  Germany .

OTHER PUBLICATIONS

Digital Technical Journal, "Circuit Implementation of a 300–MHz 64–bit Second–generation CMOS Alpha CPU", vol. 7, No. 1, 1995, pp. 100–115.

*Primary Examiner*—Tuan T. Lam
*Attorney, Agent, or Firm*—Anthony V. S. England

[57] ABSTRACT

A method and apparatus are provided for generating synchronized clock signals. According to the method and apparatus, first and second pluralities of signals are generated, having time-varying phase differences with respect to a reference clock. The first clock is supplied by a succession of signals from among the first plurality of signals, in which one of the signals succeeds another responsive to a first phase difference. The second clock is supplied by a second succession of signals from among the second plurality of signals. One signal in the second succession of signals succeeds another responsive to a second phase difference. The succession among the first plurality of signals is also responsive to the second phase difference.

10 Claims, 5 Drawing Sheets

METHOD AND APPARATUS FOR COUPLED PHASE LOCKED LOOPS

CROSS-REFERENCE TO RELATED APPLICATIONS

The present application is related to co-pending application, "Method and Apparatus for Phase Rotation in a Phase Locked Loop," Ser. No. 09/004,133 [Applicant's Docket No. AT9-96-195], assigned to the assignee herein named, filed on even date herewith, and hereby incorporated herein by reference.

The present application is also related to application, "A Clock Generation Apparatus and Method for CMOS Microprocessors Using a Differential SAW Oscillator," U.S. Pat. No. 5,870,592, assigned to the assignee herein named, and hereby incorporated herein by reference.

BACKGROUND OF THE INVENTION

1. Technical Field

The present invention relates in general to integrated circuit technology. In particular, the present invention relates to clock generation devices, such as utilized in CMOS microprocessor integrated circuits.

2. Description of the Related Art

In the design of integrated microprocessor circuits utilizing dynamic circuits, it is highly desirable to employ circuits having low jitter. "Jitter" is a vibration or fluctuation in a signal. In integrated circuit devices in particular, jitter is often the result of supply noise and substrate noise, and is seen as short-term instabilities in either the amplitude or phase of a signal. Jitter can thus be described as uncertainty in the occurrence of a clock edge. Two types of jitter, negative jitter and positive jitter, are usually encountered in integrated circuit devices. Negative jitter is the amount of time a clock edge precedes its ideal time. Positive jitter is the amount of time a clock edge lags its ideal time. Negative jitter of clock sources detracts from the usable cycle time of microprocessor systems.

As one example of the importance of jitter, for high-resolution graphic display devices utilizing phase-locked loop designs, the jitter performance of phase-locked loops limits the system performance. (A phase-locked loop ("PLL") is a circuit or system that utilizes feedback to maintain an output signal in specific phase relationship with a reference signal.) Power-supply noise coupling is a major cause of jitter problems seen in such PLL's, especially with low-supply voltages and with multiple clock synthesizers on the same device.

The utilization of PLL's for generating microprocessor clocks is well known in the art of integrated circuit design. For PLLs located on the same chip as a high-performance microprocessor, the power supply switching noise of the digital circuits is a major noise source for output jitter. For low-power PLLs, a second jitter source is the intrinsic noise of metal-oxide silicon devices in the PLL voltage controlled oscillator. This noise can be reduced by increasing power consumption. To obtain low-voltage analog circuits, the saturation voltage of MOS devices must be reduced by utilizing wider devices, which results in a larger parasitic capacitance between the supply voltage and the analog nodes. This larger parasitic capacitance decreases the power supply noise rejection for the same current consumption. Thus, a challenge in utilizing PLL's for microprocessor clock generation is to design a PLL which combines limited jitter, low-supply voltage and low-power consumption.

Despite improvements in PLL based system jitter, the above described problems present difficulties in their application.

Surface acoustic wave ("SAW") oscillators would seem attractive for PLL applications, since SAW oscillators operate at very high frequencies and are manufactured to meet precise frequency specifications, such as having jitter of only 10 picoseconds, for example. However, a conventional analog PLL includes a voltage controlled oscillator (VCO) with a relatively large jitter, such as 200 picoseconds, for example. In combining a Surface Acoustic Wave ("SAW") oscillator with a conventional PLL, the relatively the large jitter of the PLL voltage controlled oscillator adds to the much smaller jitter of the SAW.

One or more of the above referenced, copending applications discloses a SAW oscillator combined with a digital locked loop instead of the more conventional analog PLL. The term digital locked loop ("DLL"), as used to apply to the inventions disclosed herein and in the related applications, is different than a conventional DLL. Generally, the term "DLL" as used in the conventional sense and as used herein, refers to a special type of phase locked loop. Like any phase locked loop, the DLL includes circuitry for generating a periodic signal and for phase adjusting the signal based on a feedback signal. The feedback signal is derived, in part, from the periodic signal itself. In a conventional DLL there is a digital delay element within the feedback path—that is, a delay element for which the delay is adjusted in discrete steps controlled by the logical state of digital logic elements. This digital delay element is used for phase adjustment. For more background, see, for example, U.S. Pat. Nos. 5,442, 776 and 5,610,548. In the DLL of the present and related inventions, the phase adjustment is controlled digitally, but not by merely varying a digital delay element.

For an on-chip clock application, the digital-locked loop incorporating a SAW oscillator, as disclosed in the above referenced co-pending application, reduces negative jitter to approximately 10 picoseconds, based on an inherent operating jitter of 0.4% for a 400 MHz machine cycle. In comparison, a conventional analog PLL has negative jitter of approximately 200 picoseconds, based on a jitter of 8% for a 400 MHz machine cycle.

Positive jitter, on the other hand, is allowed to occur infrequently for the SAW/DLL combination, even to the extent of hundreds of picoseconds. However, because the positive jitter occurs so seldom, and the fundamental frequency of the SAW oscillator may be specified with such precision, the positive jitter is of no consequence for on-chip clock sources. That is, the resulting long-term frequency of the clock is stable at 400 MHz for on-chip applications.

While replacing a conventional PLL with a SAW-based, digital-locked loop in accordance with the above referenced patent application substantially improves the jitter for an internal chip clock, nevertheless, additional problems remain for chip-to-chip interfaces. An asynchronous chip-to-chip interface would be an alternative to deal with these problems, but metastability problems of such asynchronous interfaces are conventionally solved by pipelined latches to resynchronize data. Such latches introduce extra latency which may be unacceptable.

Thus, a need exists to reduce positive jitter penalties associated with chip-to-chip paths for DLL/SAW based clocks.

SUMMARY OF THE INVENTION

It is therefore an object of the present invention to address the foregoing need. More generally, it is an object of the present invention to provide a clock generation device broadly useful for high speed microelectronic devices. The above and other objects are achieved as is now described.

A first form of the invention encompasses a method for generating synchronized clock signals. According to this form of the invention, first and second pluralities of signals are generated, having time-varying phase differences with respect to a reference clock. The first clock is supplied by a succession of signals from among the first plurality of signals, in which one of the signals succeeds another responsive to a first phase difference. The second clock is supplied by a second succession of signals from among the second plurality of signals. One signal in the second succession of signals succeeds another responsive to a second phase difference. The succession among the first plurality of signals is also responsive to the second phase difference.

In other aspects, the succession among the first plurality of signals responsive to the second phase difference is for the second phase difference being in a first direction. Additionally, the switching among the second plurality of signals responsive to the second phase difference is for the second phase difference being in a second direction.

In further aspects, the first phase difference is a phase difference between the first clock and the reference clock. The second phase difference is a phase difference between the first and second clocks.

In another form, the invention encompasses an apparatus for generating synchronized clock signals. According to this form, the invention includes a generating means for generating first and second pluralities of signals, having time-varying phase differences with respect to a reference clock signal. It also includes first synchronizing means, responsive to a first phase difference, for supplying a first clock by a first succession of signals from among the first plurality of signals, and second synchronizing means, responsive to a second phase difference, for supplying a second clock by a second succession of signals from among the second plurality of signals. The first synchronizing means is also responsive to the second phase difference.

In further aspects, the first synchronizing means is responsive to the second phase difference being in a first direction. Also, the second synchronizing means is responsive to the second phase difference being in a second direction. Further, the first phase difference is a phase difference between the first and reference clock signals. In addition, the second phase difference is a phase difference between the first and second clock signals.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
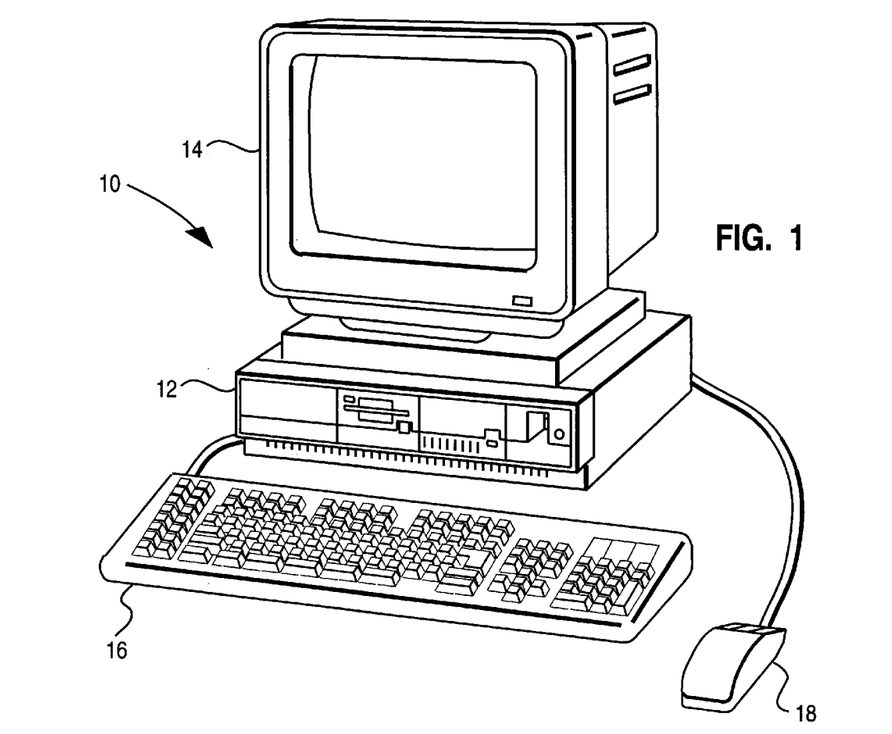
FIG. 1 is a pictorial representation of a data-processing system which may utilize the system and method of the present invention.

With reference now to the figures and, in particular, with reference to FIG. 1, there is depicted a pictorial representation of a data-processing system in which the present invention may be implemented in accordance with a preferred embodiment of the present invention. The data-processing system includes a personal computer 10 in which are implemented a system unit 12, a video display terminal 14, an alphanumeric input device (i.e., keyboard 16) having alphanumeric and other keys, and a mouse 18. An additional input device (not shown), such as a trackball or stylus, also can be included with personal computer 10. Computer 10 can be implemented utilizing any suitable computer, such as an IBM Aptiva™ computer, a product of International Business Machines Corporation, located in Armonk, N.Y. "Aptiva" is a registered trademark of International Business Machines Corporation.

Although the depicted embodiment involves a personal computer, one skilled in the art will appreciate that a preferred embodiment of the present invention may be implemented in other types of data-processing systems, such as, for example, intelligent workstations or minicomputers. Computer 10 also preferably includes a graphical user interface that resides within a machine-readable media to direct the operation of computer 10. Computer 10 also can be implemented utilizing any suitable computer, such as the IBM RISC/6000 computer, a product of International Business Machines Corporation, located in Armonk, N.Y. "RISC SYSTEM/6000" is a trademark of International Business Machines Corporation, and also can be referred to as the "RS/6000."

Figure 2:
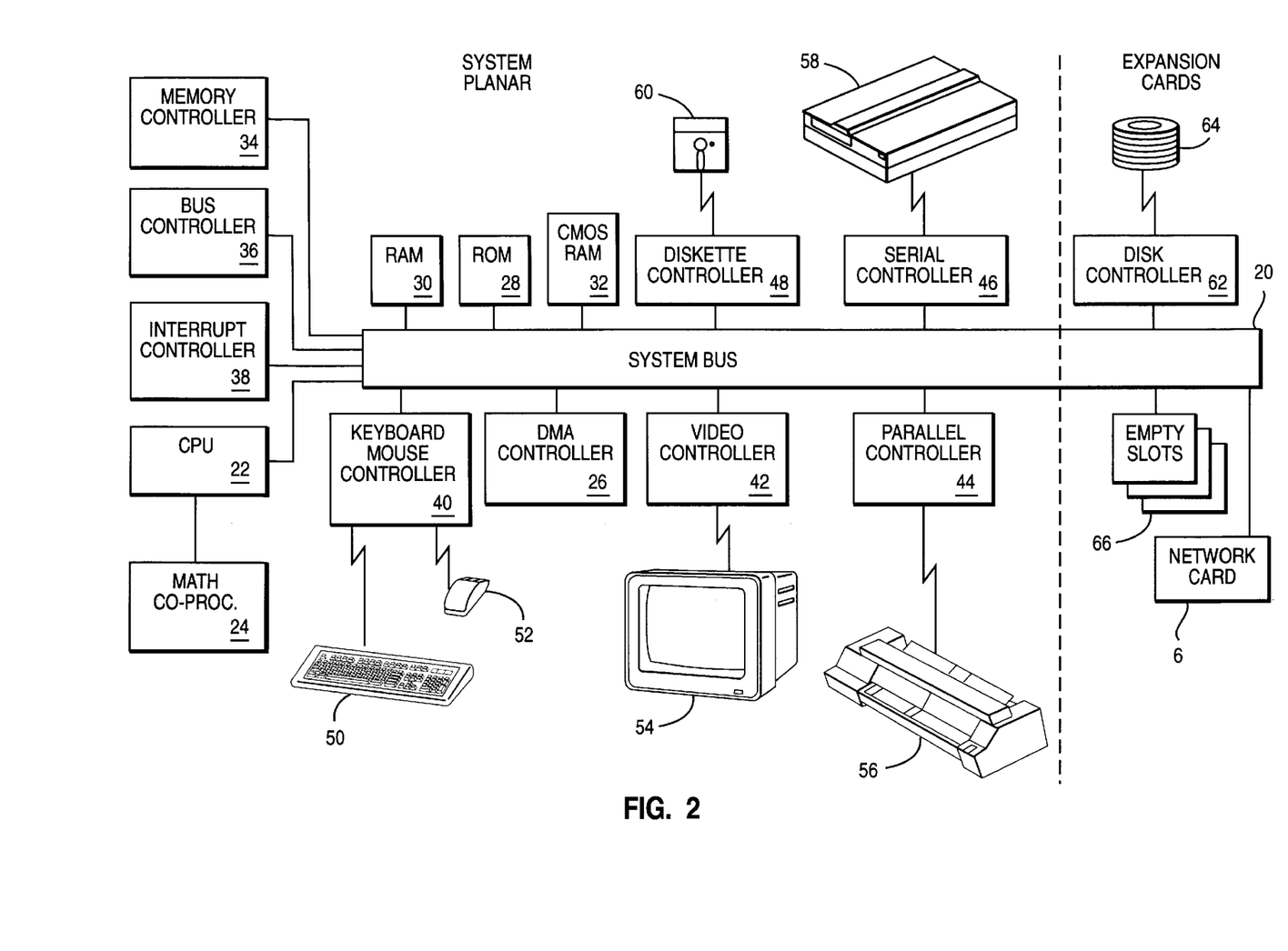
FIG. 2 depicts a block diagram illustrative of selected components in a personal computer system which may utilize the system and method of the present invention.

Referring now to FIG. 2 there is depicted a block diagram of selected components in personal computer 10 of FIG. 1 in which a preferred embodiment of the present invention may be implemented. Personal computer 10 of FIG. 1 preferably includes a system bus 20, as depicted in FIG. 2. System bus 20 is utilized for interconnecting and establishing communication between various components in personal computer 10. Microprocessor or central processing unit (CPU) 22 is connected to system bus 20 and also may have numeric co-processor 24 connected to it. Direct memory access ("DMA") controller 26 also is connected to system bus 20 and allows various devices to appropriate cycles from CPU 22 during large input/output ("I/O") transfers.

Read-only memory ("ROM") 28 and random-access memory ("RAM") 30 are also connected to system bus 20. ROM 28 is mapped into the microprocessor 22 address space in the range from 640K to 1 megabyte. CMOS RAM 32 is attached to system bus 20 and contains system-configuration information. Any suitable machine-readable media may retain the graphical user interface of computer 10 of FIG. 1, such as RAM 30, ROM 28, a magnetic diskette, magnetic tape, or optical disk.

Also connected to system bus 20 are memory controller 34, bus controller 36, and interrupt controller 38 which serve to aid in the control of data flow through system bus 20 between various peripherals, adapters, and devices. System unit 12 of FIG. 1 also contains various I/O controllers, such as those depicted in FIG. 2: keyboard and mouse controller 40, video controller 42, parallel controller 44, serial controller 46, and diskette controller 48. Keyboard and mouse controller 40 provide a hardware interface for keyboard 50 and mouse 52.

Video controller 42 provides a hardware interface for video display terminal 54. Parallel controller 44 provides a hardware interface for devices such as printer 56. Serial controller 46 provides a hardware interface for devices, such as a modem 58. Diskette controller 48 provides a hardware interface for floppy-disk unit 60. Other technologies also can be utilized in conjunction with CPU 22, such as touch-screen technology or human voice control. Expansion cards also may be added to system bus 20, such as disk controller 62, which provides a hardware interface for hard-disk unit 64. Empty slots 66 are provided so that other peripherals, adapters, and devices may be added to system unit 12 of FIG. 1. A network card 67 additionally can be connected to system bus 20 in order to link system unit 12 of FIG. 1 to other data-processing system networks. Those skilled in the art will appreciate that the hardware depicted in FIG. 2 may vary for specific applications. For example, other peripheral devices, such as: optical-disk media, audio adapters, or chip-programming devices, such as PAL or EPROM programming devices and the like also may be utilized in addition to or in place of the hardware already depicted. Note that any or all of the above components and associated hardware may be utilized in various embodiments. However, it can be appreciated that any configuration of the aforementioned system may be utilized for various purposes according to a particular implementation.

Figure 3:
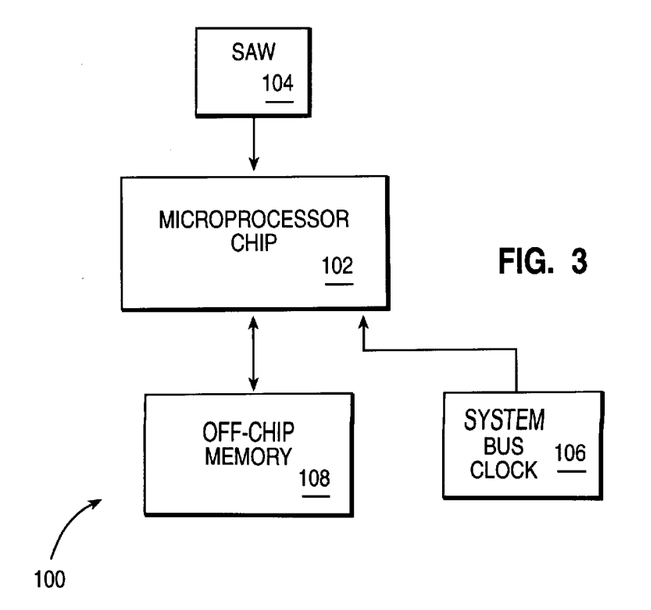
FIG. 3 is a high-level block diagram illustrative of a self-synchronizing phase delay system for coupling digital-locked loops in accordance with a preferred embodiment of the present invention.
Figure 4:
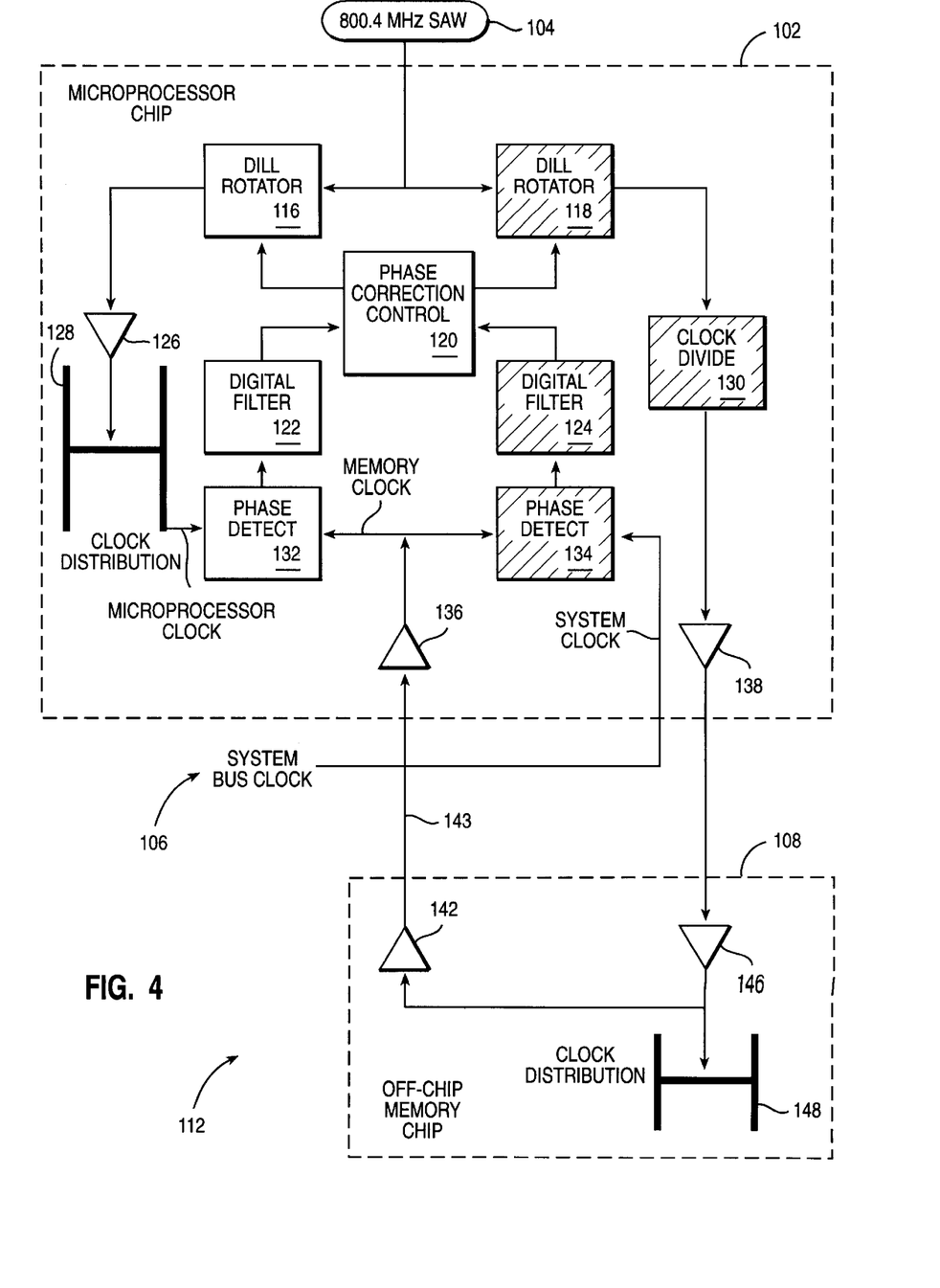
FIG. 4 is a more detailed block diagram illustrative of a self-synchronizing phase delay system for coupling digital-locked loops in accordance with a preferred embodiment of the present invention.

In FIG. 3 and FIG. 4, like parts are indicated by like numbers. FIG. 3 is a high-level block diagram illustrative of a self-synchronizing phase delay system 100 for coupling DLL's in accordance with a preferred embodiment of the present invention. System 100 is a self-synchronizing phase delay system for coupling DLL's, which causes phase adjustments of the digital-locked loops to occur simultaneously at a synchronization point.

System 100 reduces the timing penalty for misaligned phase adjustment normally associated with independently operating DLL's. The normal penalty increases chip-to-chip path time. In the configuration of FIG. 3, a SAW oscillator 104 sends a first reference signal to microprocessor chip 102, which also receives a second reference signal from system bus clock 106. An off-chip memory chip 108 is coupled to microprocessor 102, which is also coupled to a system bus 110. Microprocessor chip 102 is the physical realization of a CPU of a given computer system on either a single semiconductor chip or on a small number of chips. For example, microprocessor chip 102 can be a CPU such as CPU 22 depicted in FIG. 2.

Microprocessor chip 102 can also be included as part of a multi-chip microprocessor system, such as multi-chip uniprocessors, uniprocessors with off-chip memory, or multiprocessor configurations. A first reference signal, system bus clock 106, is provided to microprocessor chip 102 via bus lines. SAW oscillator 104 provides a second reference signal. SAW oscillator 104 can be a crystal oscillator based on an appropriate oscillation producing material such as quartz crystals. Off-chip memory chip 108 can provide extra memory, such as a cache memory area, for utilization with microprocessor chip 102. Together, microprocessor 102 and off-chip memory chip 108 provide the basis of a multiprocessor.

FIG. 4 is a more detailed block diagram illustrative of a self-synchronizing phase delay system 112 for coupling DLL's in accordance with a preferred embodiment of the present invention. Details of the various functional blocks of FIG. 4 are described in the above referenced and incorporated, co-pending applications. SAW oscillator 104 is preferably an 800.4 MHz SAW oscillator. Microprocessor chip 102 includes a first DLL rotator 118 which receives the second reference signal, i.e., the signal from SAW oscillator 104. A second DLL rotator 116 also receives the signal from SAW oscillator 104.

The rotators 116 and 118 generate a number of signals in response to the SAW oscillator input signal, which are used in turn as a source signal for a clock. In the embodiment described herein below in connection with FIG. 5, four signals are generated by such a rotator. The first such signal generated by such a rotator leads the second signal by ¼ cycle, the second signal leads the third by ¼ cycle, and the fourth signal leads the third by ¼ cycle. One of the four signals is selected as a source signal at a time for output by such a rotator. Furthermore, the selection of source signals goes in sequence, wherein the second signal is selected following the first, the third signal is selected following the second, and so on. Hence, the term "rotate" is used to refer to a change in the selected source for the output signal from such a rotator, since the selection rotates among the four possible source signals in the 1-2-3-4-1-etc. sequence. And the term "stall" is also used to refer to such a change in the selected source signal for outputing from such a rotator, since each of the four signals is ¼ cycle behind the preceding signal, so that switching from the first signal to the second, and so forth substantially instantaneously introduces a ¼ cycle shift in the rotator output in a lagging direction.

First DLL rotator 118 provides a first clock signal to clock divider 130, which reduces the frequency of the first clock signal by a predetermined multiple, such as by a multiple of two, to provide a "memory clock" signal, i.e., a clock signal for off-chip memory.

Second DLL rotator 116 sends a second clock signal to buffer 126, which in turn provides the buffered clock signal to clock distribution system 128. Clock distribution system 128 distributes the buffered clock signal (the "microprocessor clock" signal) throughout the distribution system 128.

Output from phase correction control circuit 120 is input to first DLL rotator 118 and second DLL rotator 116. A control signal from second phase detector 132 is fed to second digital filter 122. A control signal from second digital filter 122 is fed to phase correction control circuit 120. A control signal from first phase detector 134 is fed to first digital filter 124. A control signal from first digital filter 124 is also fed to phase correction control circuit 120.

Second phase detector 132 receives the second clock signal from DLL Rotator 116 via clock distribution 128. First phase detector 134 receives the first reference signal from system bus clock 106. Buffer 136 provides the clock signal from divider 130 to second phase detector 132 and first phase detector 134.

Off-chip memory chip 108 includes a buffer 142 which receives the clock signal from divider 130, via buffers 138 and 146. Output from buffer 146 is also coupled to clock distribution system 148.

System 112 allows first and second clock signals from first and second DLL rotators 118 and 116 to be placed under coordinated control. That is, the first and second clock signals are fed back, including through the clock distribution path 128 and interchip paths (between the microprocessor and the off-chip memory), to control circuitry, so that the first and second clock signals can be synchronized to each other and the system bus clock 106.

The system bus clock and memory clock are phase locked as follows. First phase detector 134 detects a phase difference between the system bus clock and the memory clock, derived from the first clock as divided by bus divider 130 and delayed by interchip paths, and provides a control signal responsive to the measured phase error to digital filter 124. The first digital filter integrates the error signal and provides a control signal responsive thereto to the phase correction control circuitry 120, which controls stalling of the memory clock signal by the first rotator 118.

The microprocessor clock and memory clock are synchronized by rotating the source for the microprocessor clock each time a source for the memory clock also undergoes a rotation. That is, second phase detector 132 detects a phase difference between the microprocessor clock (i.e., DLL rotator 116 output) and the memory clock (i.e., DLL rotator 118 output) and provides a control signal responsive to the phase difference (i.e. error signal) to digital filter 122. This second digital filter 122 integrates the error signal and provides a control signal responsive thereto to the phase correction control circuitry 120, which controls stalling of the second (i.e. microprocessor) clock signal by the second rotator 116. The net effect on DLL rotator 116, of the control by phase detector 132, digital filter 122, and phase correction control circuitry 120, is that the microprocessor clock signal, i.e., output from DLL rotator 116, undergoes a rotation in response to rotations of the memory clock signal, i.e, output from DLL rotator 118, since a rotation (i.e., stall) of the memory clock signal will cause the microprocessor clock to lead the memory clock, and this will be corrected through phase detector 132, etc.

If, on the other hand, the memory clock gets ahead of the microprocessor clock, phase correction control circuitry 120 causes the memory clock rotator 118 to stall in response to the error signal from the microprocessor clock phase detector 132.

Phase correction control by circuitry 120 triggering a rotation of memory clock DLL rotator 118, in response to microprocessor-clock-versus-memory-clock-phase-detector 132, need only be performed at a low frequency (e.g., 1 kHz), which is fast enough to account for ambient thermal changes in the clock propagation loops.

From the foregoing, it can be appreciated that the memory clock signal derived from the SAW oscillator and reduced in frequency by divide circuitry 130, is designed to be slightly faster than the system bus clock 106. Moreover, the SAW oscillator 104, DLL rotator 118, divide circuitry 130, signal paths, phase detector 134, digital filter 124 and phase correction controller 120 form a first DLL which stalls the memory clock as required so that the memory clock remains synchronized with the system bus clock. In this first DLL, the rotator 118 generates a first plurality of signals, in response to the first reference signal from the SAW oscillator. The first plurality of signals have time-varying phase differences with respect to the second reference clock signal from the system bus clock.

Also, the SAW oscillator 104, DLL rotator 116, microprocessor clock paths, including distribution 128, phase detector 132, digital filter 122 and phase correction controller 120 form a second DLL which stalls the microprocessor clock responsive to the microprocessor clock leading the memory clock. This synchronizes the memory clock and the microprocessor clock when the microprocessor clock leads the memory clock. In this second DLL, the rotator 116 generates a second plurality of signals, in response to the first reference signal from the SAW oscillator. The second plurality of signals have time-varying phase differences with respect to the second reference clock signal from the system bus clock.

All of the above mentioned elements of both DLL's, except phase detector 134 and digital filter 124, form a third DLL which stalls the memory clock responsive to the microprocessor clock lagging the memory clock. This synchronizes the memory clock and the microprocessor clock when the microprocessor clock lags the memory clock.

Figure 5:
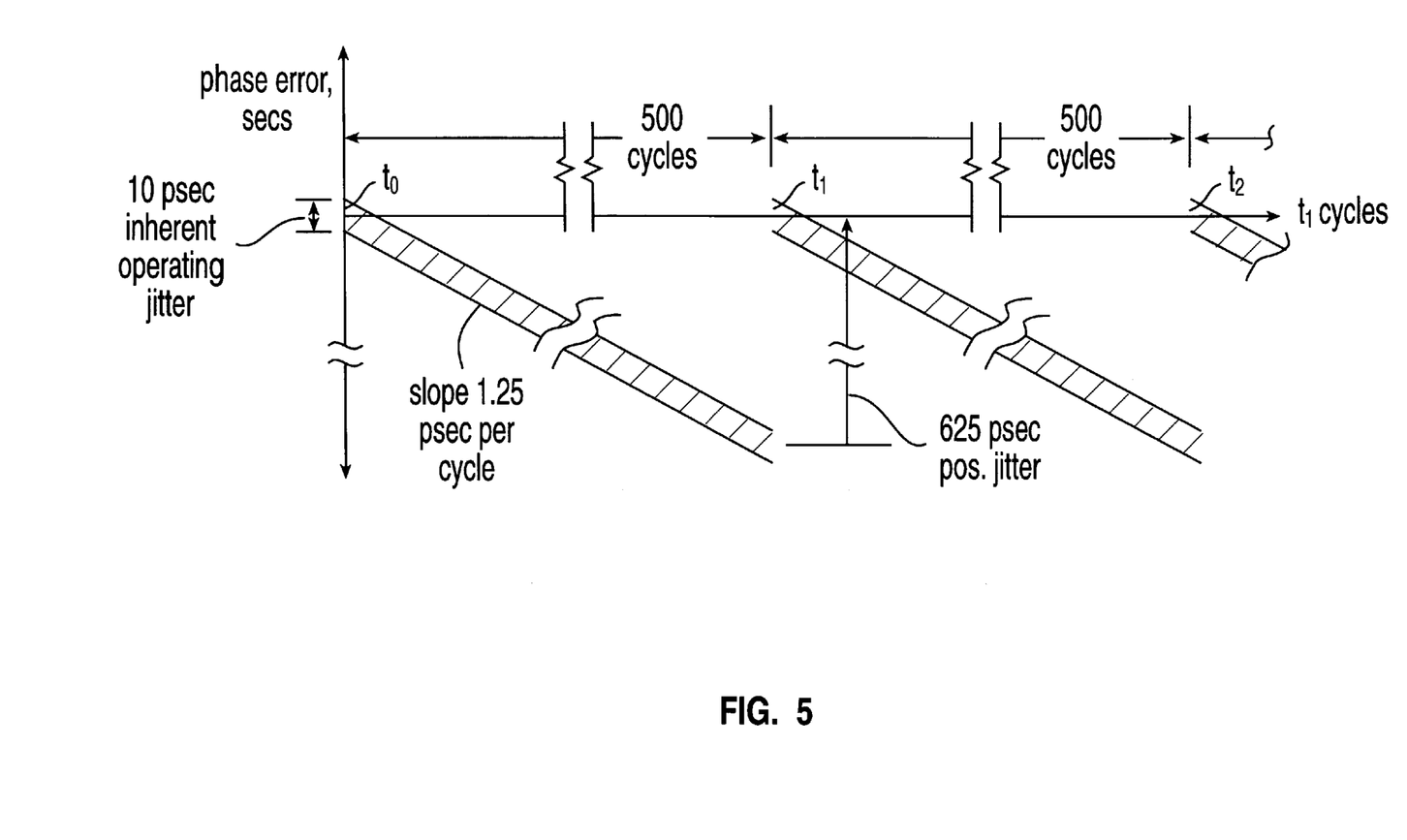
FIG. 5 is a diagram of phase error versus time, for a single digital-locked loop using a surface acoustic wave oscillator.

It is helpful to consider timing details of a single DLL, in accordance with the above described co-pending applications, before considering such details for the coupled DLL's described herein above. In FIG. 5, clock phase error is shown as a function of time for a single DLL using a SAW oscillator. This example depicts a desired 400 MHz clock signal. Therefore, the phase error shown is a phase error relative to the desired 400 MHz target frequency.

In this example, four possible source signals are derived from the 800.4 MHz SAW oscillator signal, wherein the second signal is ¼ phase behind the first signal, the third signal is ¼ phase behind the second signal, etc. Initially the first possible source signal is used as the source signal for the desired 400 MHz clock signal. The source for the clock signal is switched from the first possible source signal to the second possible source signal, from the second to the third, and so on. The phase error shown in FIG. 5 is generated by the selected source signal, and, as previously stated, is measured with respect to the target 400 MHz clock signal. That is, during the first interval shown, from t0 to t1, the source signal depicted is from the first possible source signal; during the second interval shown, from t1 to t2, the source signal depicted is from the second possible source signal; etc.

Beginning at time t0 in FIG. 5, the depicted 400.2 Hz source signal creeps ahead of the desired 400 MHz target by 0.2/400 of the desired cycle for each cycle of the source. Since one cycle at 400 MHz=2500 psec, this is shown in FIG. 5 as a phase error increasing in time with a slope of 0.2/400*2500 psec per cycle, i.e. a slope of 1.25 psec/cycle. In addition, it is typical for a SAW oscillator in this fundamental frequency range to have a total operating jitter of 10 psec. Therefore, FIG. 5 shows the 1.25 psec/cycle phase error slope as a band, 10 psec wide.

Operating at the 400.2 MHz frequency, after 500 cycles the signal derived from the SAW oscillator gains ¼ cycle, with respect to the target 400 MHz. That is, ¼ cycle=(0.2/400 increasing phase error per cycle)*(500 cycles). In response to reaching the phase error of ¼ cycle, which ideally occurs at time t1, the source signal is switched from the first possible source signal to the second. Since the second possible source signal is ¼ phase behind the first, at 400.2 MHz, this introduces a substantially instantaneous positive shift in phase error very slightly less than ¼ cycle, i.e. a (400/400.2)/4 positive shift in phase error, so that the accumulated negative phase error is completely offset to within a margin much smaller than the inherent operating jitter. Ideally the switch will be made in response to slightly less than the ¼ cycle accumulated phase error, so that the positive shift in phase error even more precisely matches the accumulated negative phase error; however, for the purpose of illustration in FIG. 5, the switching is shown to occur at 500 cycles for an accumulated ¼ cycle negative phase error, and the correction is nevertheless shown to exactly offset the accumulated phase error.

Stated in terms of positive and negative jitter, in addition to 10 psec uncontrolled positive jitter arising from the 10 psec operating jitter inherent in the stepped down SAW oscillator signal, once every 500 cycles 625 psec positive jitter is intentionally introduced by switching to a ¼ phase lagging signal. As to negative jitter, in addition to 10 psec uncontrolled negative jitter also arising from the inherent 10 psec operating jitter, 1.25 psec negative jitter per cycle is intentionally accumulated over an interval of 500 cycles due to the intentional specification of a fundamental frequency derived from the SAW oscillator being 0.2 MHz faster than the desired 400 MHz clock signal.

After switching from the first possible source signal to the second, at time t1, the negative phase error again begins accumulating at the same rate of 0.2/400 cycles/cycle. Then, ideally at time t2, after again gaining ¼ cycle, the source signal switches again to the third possible source signal, which is ¼ cycle behind. This process continues repeating in rotation, switching from the third to the fourth possible source signal, from fourth to the first, and so on.

It should be appreciated that averaged over 500 cycles, the above described, single DLL/SAW oscillator in the above example reduces jitter to about 8.75 psec average positive jitter and 11.25 psec average negative jitter, including the inherent 10 psec operating jitter. Furthermore, since it is well known to manufacture SAW oscillators to a fundamental frequency tolerance of 500 ppm, the separation between the target clock frequency (i.e., 400 MHz in the example) and the source frequency (i.e., 400.2 MHz in the example) could be reduced to less than the 0.2 MHz separation used in the example. This would reduce average jitter even further.

It should thus be appreciated that average jitter can be reduced to a value approaching the inherent operating jitter for a single DLL/SAW oscillator based clock as described above. Nevertheless, the relatively infrequent, but large positive instantaneous jitter for such a clock still poses a significant limitation for applications where independent DLL/SAW oscillator clock sources are coupled but where the intentionally introduced jitter is not synchronized, since the maximum unsynchronized instantaneous jitter of two clock signals limits usable cycle time when data is transferred from a device timed by of one of the clocks to a device under the timed by the other clock. That is, available cycle time is limited by the latest launch time by the device sending data and the earliest capture time by the device receiving data. Latest launch time is determined by the maximum instantaneous positive phase error of the clock for the launching device, where the error is not synchronized with that of the receiving device. Earliest capture time is determined by the maximum instantaneous negative phase error of the clock for the receiving device, where the error is likewise not synchronized. Thus, for 400.2 MHz DLL/SAW oscillators sourcing 400 MHz clock on respective sending and receiving devices, per the maximum instantaneous jitter values derived in the above example, the usable cycle time will not even be as much as 0.75 cycle.

Figure 6:
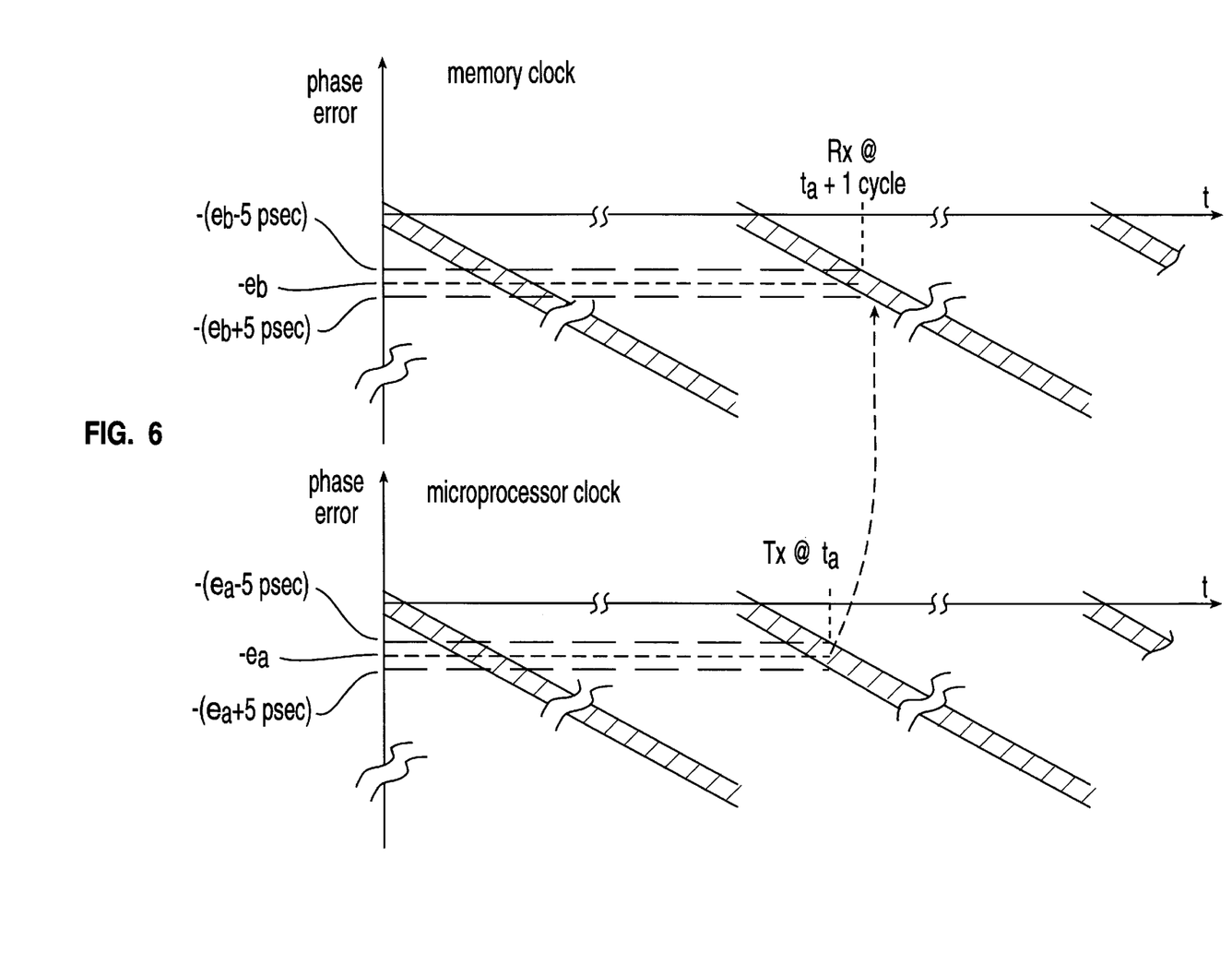
FIG. 6 is a diagram of phase error versus time for coupled digital-locked loops in accordance with the system of FIG. 4.

FIG. 6 depicts phase errors for the coupled memory clock and microprocessor bus clock which are synchronized as described in connection with FIG. 4. Specifically, the intentionally introduced, increasing negative phase error, and instantaneous, though infrequent positive jitter, introduced once each 500 cycles, are synchronized for the two clock signals, so that their effect is not cumulative with respect to launching and capturing data in transfers between the microprocessor and memory. Therefore, only the inherent operating jitter, assumed to be 10 psec, plus the intentionally introduced constant 1.25 psec/cycle negative jitter reduces the cycle time available for such data transfers. Thus, the effective cycle time is reduced by only 11.25 psec.

This is illustrated in FIG. 6, for example at a time, ta, when a signal is launched from a microprocessor clocked by the microprocessor clock to the memory clocked by the memory clock. Suppose the intentionally introduced phase error, ea, of the microprocessor clock at time ta is −100 psec, so that taking into account the 10 psec operating jitter, the phase error is in the range −95 to −105 psec. The phase error for the memory clock at time ta is in the same range, since the intentionally introduced phase error is synchronized with that of the microprocessor clock. The memory clock, however, will capture the signal one cycle after the microprocessor launched it. Thus, the memory clock will have an intentionally introduced phase error, eb, at the time of capture which will be −101.25 psec, due to the intentionally introduced −1.25 psec phase error/cycle. The range of phase error for the memory clock at capture, therefore, taking into account operating jitter, will be −96.25 to 106.25 psec. The worst case difference between phase error at launch and at capture, will therefore be the difference between −95 psec and −106.25 psec phase error, i.e., 11.25 psec. It should be appreciated that since the intentionally introduced phase error is synchronized for the two clocks, the result will be the same regardless of the choice of time ta. On the other hand, if the intentionally introduced phase error was not thus synchronized, ea and eb would not necessarily be only 1.25 psec apart for any launch time ta, so the maximum possible phase error difference and possible accompanying cycle time loss could be as great as 635 psec, in this example.

While the invention has been particularly shown and described with reference to a preferred embodiment, it will be understood by those skilled in the art that various changes in form and detail may be made therein without departing from the spirit and scope of the invention.

What is claimed is:

1. A method for generating synchronized clock signals, comprising the steps of:
   a) generating first and second pluralities of signals, having time-varying phase differences with respect to a reference clock signal;
   b) supplying a first clock signal by a first succession of signals from among the first plurality of signals, wherein the signals succeed one another responsive to a first phase difference; and
   c) supplying a second clock signal by a second succession of signals from among the second plurality of signals, wherein the signals succeed one another responsive to a second phase difference, and wherein the first succession of signals is also responsive to the second phase difference.

2. The method of claim 1, wherein for the first succession of signals, the succession of one of the signals by another one of the signals is responsive to the second phase difference being in a first direction.

3. The method of claim 2, wherein for the second succession of signals, the succession of one of the signals by another one of the signals is responsive to the second phase difference being in a second direction.

4. The method of claim 1, wherein the first phase difference is a phase difference between the first clock signal and the reference clock signal.

5. The method of claim 1, wherein the second phase difference is a phase difference between the first clock signal and the second clock signal.

6. An apparatus for generating synchronized clock signals, comprising:

a) first signal source for generating first plurality of signals, having time-varying phase differences with respect to a reference clock signal;
b) second signal source for generating second plurality of signals, having time-varying phase differences with respect to the reference clock signal;
c) first phase detector, responsive to a first phase difference, for supplying a first control signal, wherein the first signal source, responsive to the first control signal, supplies a first clock signal by a first succession of signals from among the first plurality of signals; and
d) second phase detector, responsive to a second phase difference, for supplying a second control signal, wherein the second signal source, responsive to the second control signal, supplies a second clock signal by a second succession of signals from among the second plurality of signals, wherein the first signal source is also responsive to the second phase difference.

7. The apparatus of claim 6, wherein the first signal source is responsive to the second phase difference being in a first direction.

8. The apparatus of claim 6, wherein the second signal source is responsive to the second phase difference being in a second direction.

9. The apparatus of claim 6, wherein the first phase difference is a phase difference between the first clock signal and the reference clock signal.

10. The apparatus of claim 6, wherein the second phase difference is a phase difference between the first clock signal and the second clock signal.

* * * * *